United States Patent [19]

Mogi

[11] Patent Number: 5,303,400
[45] Date of Patent: Apr. 12, 1994

[54] RADIO FREQUENCY RECEIVER INCLUDING DUAL RECEIVERS FOR INCREASING SCANNING SPEED

[75] Inventor: Kazuhiko Mogi, Saitama, Japan

[73] Assignee: Pioneer Electronic Corporation, Tokyo, Japan

[21] Appl. No.: 680,865

[22] Filed: Apr. 5, 1991

[30] Foreign Application Priority Data

Apr. 23, 1990 [JP] Japan .................................. 2-105350

[51] Int. Cl.⁵ .............................................. H03J 7/18
[52] U.S. Cl. .................................. 455/186.1; 455/132; 455/161.3; 455/167.1
[58] Field of Search ............... 455/167.1, 185.1, 186.1, 455/161.2, 161.1, 176.1, 161.3, 132, 184.1, 188.1, 180.1, 168.1, 133, 134, 152.1

[56] References Cited

U.S. PATENT DOCUMENTS 3,456,192  7/1969  Mixsell et al. .................... 455/161.1
4,179,662 12/1979  Pflasterer .......................... 455/168.1

FOREIGN PATENT DOCUMENTS 0058934  9/1982  European Pat. Off. .
0333194  2/1990  European Pat. Off. .
0079521  6/1980  Japan ................................ 455/161.3
0101723  4/1989  Japan ................................ 455/167.1

Primary Examiner—Reinhard J. Eisenzopf
Assistant Examiner—Chi Pham
Attorney, Agent, or Firm—Sughrue, Mion, Zinn, Macpeak & Seas

[57] ABSTRACT

A radio receiver including a first receiver and a second receiver means which sweep frequencies of the divided regions of one reception band respectively or from lower end to upper end of one reception band. A control circuit stores received broadcasting stations having the reception quality level higher than the levels specified by sweeping the first receivers and the second receiver respectively.

4 Claims, 4 Drawing Sheets

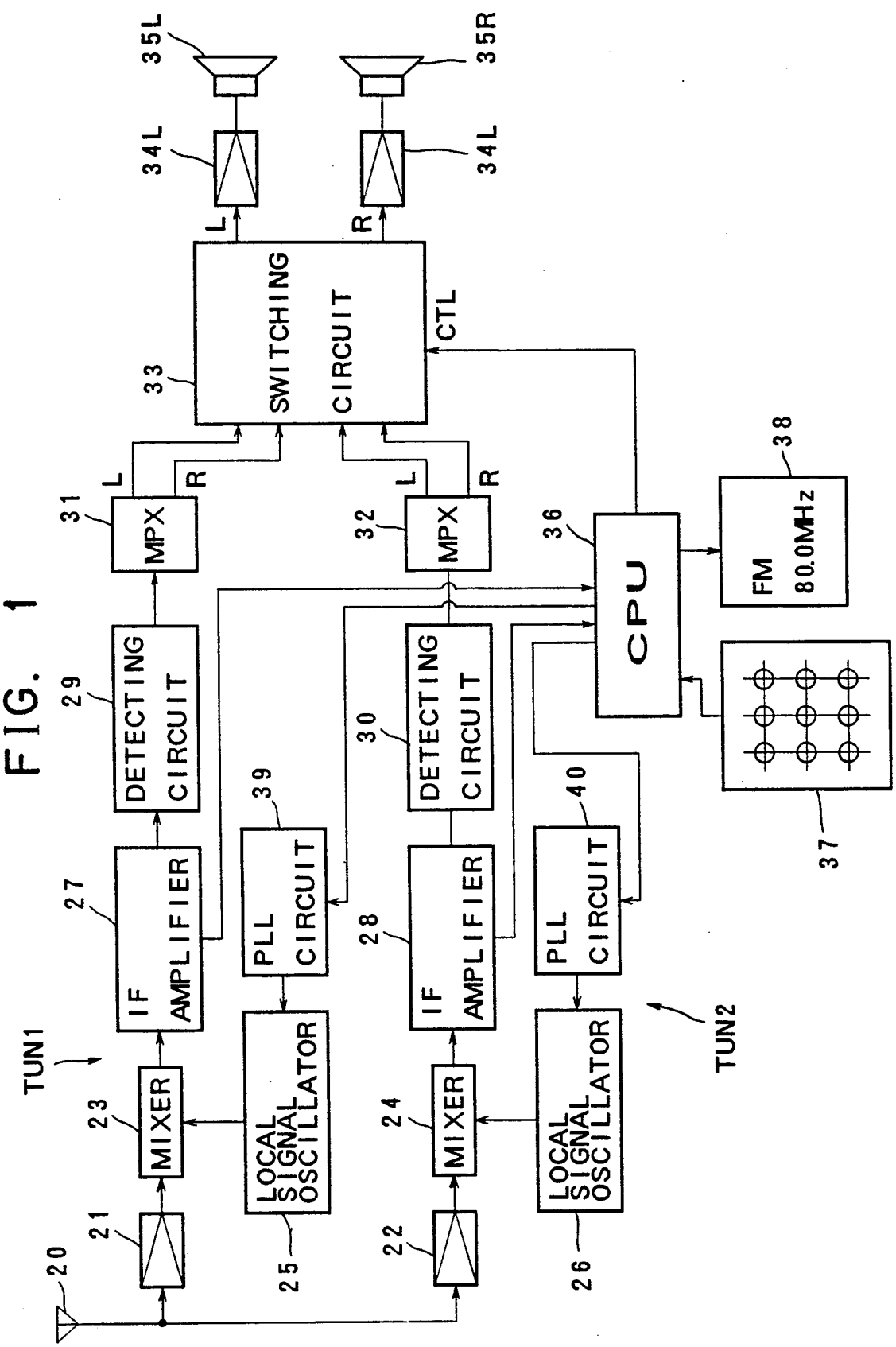

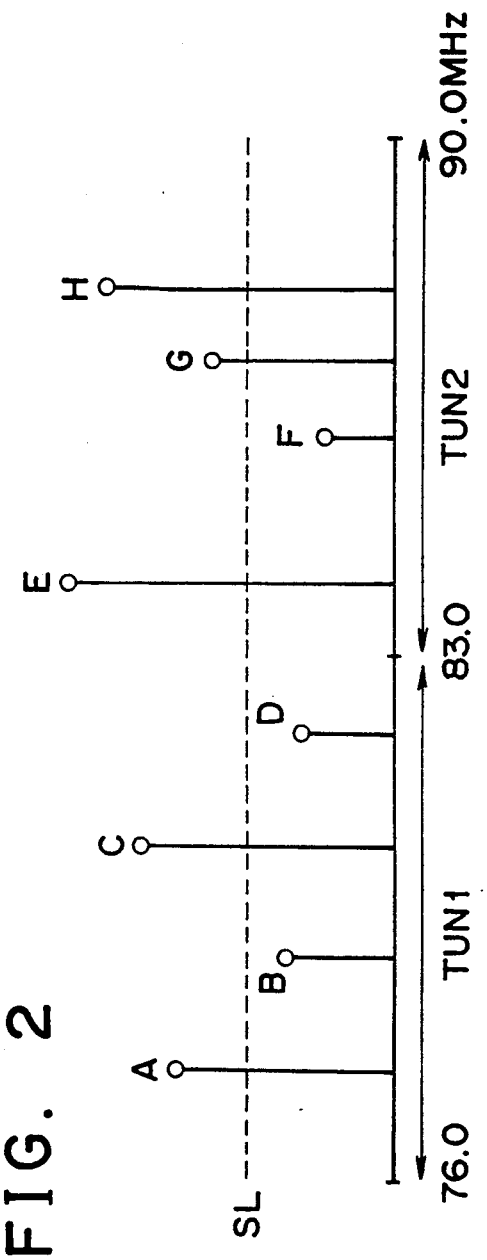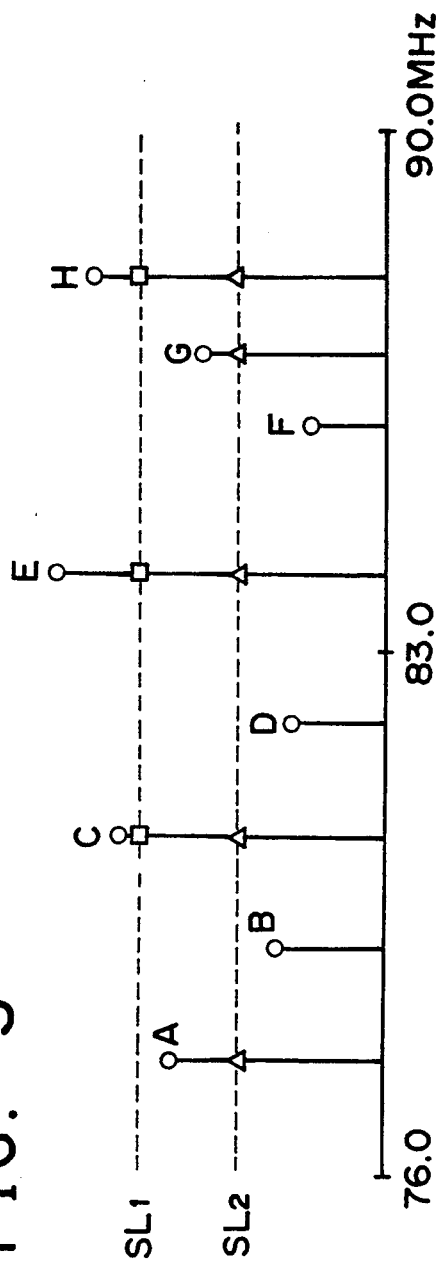

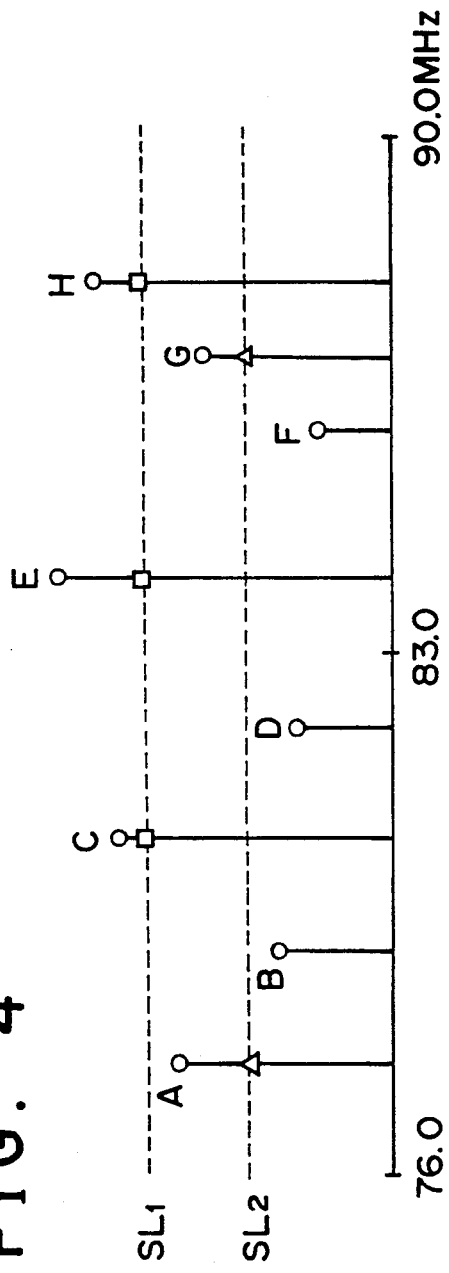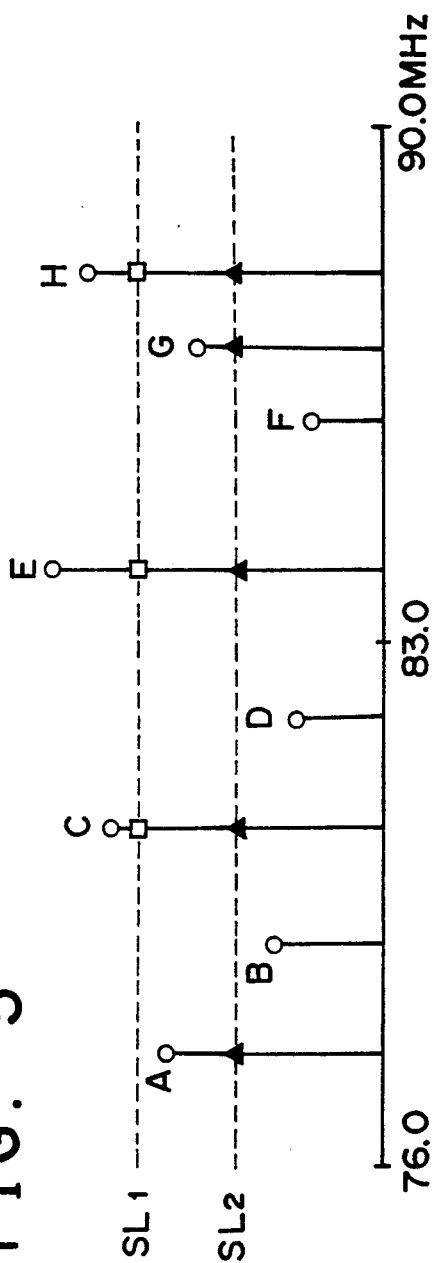

RADIO FREQUENCY RECEIVER INCLUDING DUAL RECEIVERS FOR INCREASING SCANNING SPEED

BACKGROUND OF THE INVENTION

1. Field of the Invention

The present invention relates to a radio frequency receiver of twin-tuner type provided with two systems of receivers.

2. Description of the Prior Art

There has been an increasing demand for a radio receiver to output demodulated signal of higher reception quality, and many kinds of proposals have been made so far concerning the above.

For example, a receiver having such function is being proposed which can detect stations having higher electric field intensity in a specified area automatically, write some of those stations into a preset assigned area in a memory in the order of the height of electric field, and call the stored stations in the memory by the preset button operation.

Such a function is called BSM (Best Stations Memory), which function includes sweeping of received frequencies, for example, from low end to upper end of the reception band, writing of frequencies having higher electric field intensity than that of the specified level into the memory, and presetting of the frequencies in the order of the intensity level of electric field in accordance with the preset button etc.

One example of the radio receiver provided with the above-mentioned functions is shown in FIG. 6.

In FIG. 6, numerical 1 designates a radio frequency (RF) receiving antenna, and the RF signal received through this antenna 1 is amplified by an RF amplifier 2 and then applied to a mixer 3. Local signal outputted from a local signal oscillator 4 constituted by, for example, a PLL circuit is fed to the mixer 3 and the received signal is here converted to an intermediate frequency signal.

Intermediate frequency signal thus obtained by the mixer 3 is selectively amplified by an intermediate frequency amplifier 5 and demodulated by a detector 6 of the next stage. The demodulated signal output by the detector 6 is further stereo-demodulated by a multiplexing circuit 7 and passes through a muting circuit 8 and is applied to power amplifiers 9L, 9R for amplifying left and right sound signals.

Then, the demodulated sound signals amplified by the power amplifiers 9L, 9R are reproduced by loudspeakers 10L, 10R.

On the other hand, the output signal produced by detecting the level of the intermediate frequency signal, in other words, the output signal corresponding to the reception electric field intensity is applied from the intermediate frequency amplifier 5 to a central processing unit 11 comprising a microprocessor.

A keyboard 12 by which the desired frequencies etc. to be received are inputted, a display 13 indicating the frequencies etc. to be received and the local signal oscillator 4 constituted by the above-mentioned PLL circuit are all connected to the central processing unit 11.

In the constitution as mentioned above, when the BSM function as above is operated during the RF reception, the mute control signal from the central processing unit 11 is applied to the muting circuit 8 so as to prevent the frequency being presently received and reproduced from being demodulated. Immediately after the above operation, the central processing unit 11 sends a command to the local signal oscillator 4 for sweeping the frequencies to be received from low end to high end of the reception band, and the receiver begins to scan the tuning operation of the frequencies sequentially.

At this time, the reception level outputted from the intermediate frequency amplifier 5 is applied to the central processing unit 11, and when the outputted reception level is equal to or higher than a predetermined level, the central processing unit 11 stores the level value and the corresponding received frequency at that time.

When the tuning scanning from low end to high end of the reception band is completed, the central processing unit 11 presets the received frequencies corresponding to preset buttons according to their reception levels. The central processing unit 11 then outputs the control signal to the local signal oscillator 4 in order to tune the frequency of the maximum frequency level, and then sends a signal for clearing the muting function to the muting circuit 8, so that the receiver results in receiving and reproducing the highest reception level of the frequency in that area.

In case the above-mentioned BSM operation is intended to be carried out, for example, referring to FM band in Japan, a frequency band 76–90 MHz will be swept by step of every 0.1 MHz. Assuming the time required for sweeping at each step is 50 msec, the time necessary to sweep from low end to high end of the FM band becomes 7 sec +, during which time the reception is thus muted, so that it is regarded as a waiting time.

Apart from the above-mentioned BSM function which utilizes means for sweeping from the low end to high end of one of FM band, another BSM function has also been proposed heretofore, wherein the detecting level of the frequency is set to high level in the first sweep, that is, the level of the frequency reception is set to the "LOCAL" position so as to extract the broadcasting station received thereby, and the detecting level is then lowered in the second sweep, that is, the level of the frequency reception is, this time, set to the "DX" position so as to extract the broadcasting station received thereby. By this operation, broadcasting stations are received in the order of the height of its reception sensitivity.

However, the BSM function as above requires twice as long as the above-mentioned waiting time.

As described above, the radio receiver according to the prior art requires a considerable waiting time, for example, during the operation of BSM function, and consequently a user can not obtain any information from the radio receiver during such waiting time.

SUMMARY OF THE INVENTION

The present invention has been made in view of the above-mentioned points, and aims to provide a radio receiver which is able to reduce the above-mentioned waiting time.

A radio receiver made according to the present invention in order to solve the above-mentioned problems, wherein the reception band thereof is divided into a first region and a second region, is characterized by the provision of a first receiver for sweeping frequencies of the first region, a second receiver for sweeping frequencies of the second region, and a control circuit which stores the received broadcasting stations having reception quality higher than a specified level into a memory in the order of the height of reception quality level, after these stations are respectively obtained by sweeping the above-mentioned first receiver and second receiver.

Further, a radio receiver made according to the present invention to solve the above-mentioned problems is characterized by the provision of a first receiver and a second receiver for individually sweeping frequencies from lower end to upper end of the same reception band, and a control circuit which stores the received broadcasting station having reception quality higher than the respectively specified first and second levels into a memory in the order of the height of reception quality level, after these stations are obtained by respectively sweeping the above-mentioned first and second receivers.

According to the first aspect of the radio receiver of the present invention, first and second receivers corresponding to the respective first and second regions dividedly formed in a reception band are provided for sweeping frequencies of the respective regions, wherein the first receiver and the second receiver sweep simultaneously, for example, frequencies of the first half and the second half of the reception band.

Also according to the second aspect of the radio receiver of the present invention, a first receiver and a second receiver for individually sweeping frequencies from lower end to upper end of the same reception band are provided, wherein these receivers perform sweeping operation with respective extraction sensitivities of the reception levels which are different from each other.

BRIEF DESCRIPTION OF THE DRAWINGS

FIG. 1 is a block diagram showing an embodiment of the present invention;

FIG. 2 is an operating characteristics diagram explaining functions of the embodiment shown in FIG. 1;

FIG. 3 is an operating characteristics diagram of a receiver of the present invention operating by a different program of a receiver of the present invention operating by a different program from that of FIG. 2;

FIG. 4 is an operating characteristics diagram of a receiver of the present invention operating by further different program from that of FIG. 3;

FIG. 5 is an operating characteristics diagram of a receiver of the present invention by still further different program from that of FIG. 4.

DETAILED DESCRIPTION OF THE PREFERRED EMBODIMENTS

Figure 6:
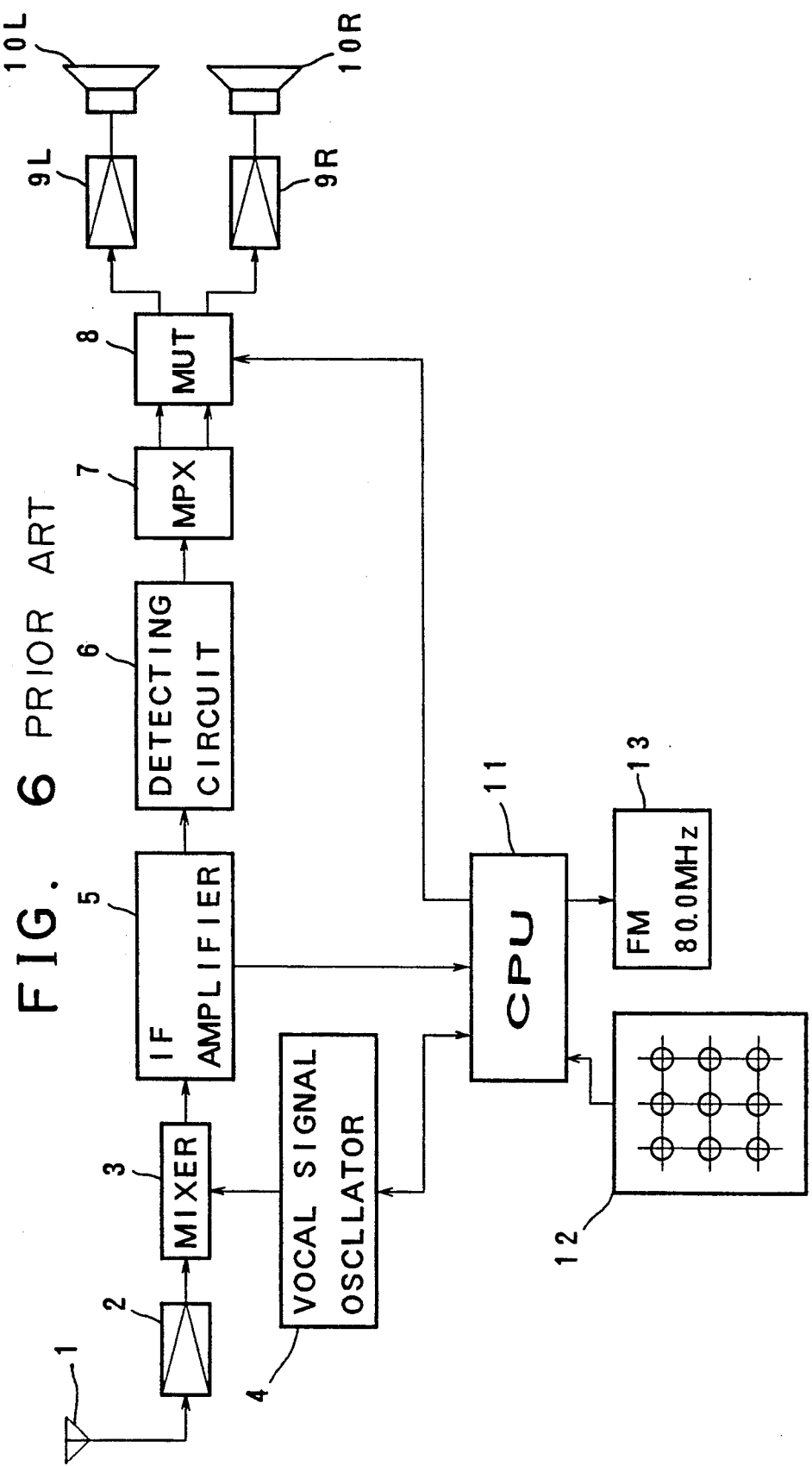
FIG. 6 is a block diagram showing an example in the prior art.

Embodiments of the present invention will be described referring to the accompanying drawings as follows.

FIG. 1 shows an embodiment of a radio receiver according to the present invention. That is, in FIG. 1, RF signals received through an antenna 20 are applied respectively to an RF amplifier 21 constituting a first receiver TUN1 and an RF amplifier 22 constituting a second receiver TUN2 and amplified by the RF amplifiers 21, 22 so as to be applied to mixers 23, 24 thereafter.

Local signal oscillators 25, 26 are connected to the mixers 23, 24 respectively, and received RF signals are mixed with the local signals derived from the local signal oscillators 25, 26 and then converted into intermediate frequency signals. The intermediate frequency signals are amplified by intermediate frequency amplifiers 27, 28 and then demodulated by detecting circuits 29, 30 respectively, whose demodulated outputs are fed to multiplexing (MPX) circuits 31, 32.

The demodulated outputs applied to the MPX circuits 31, 32 are separated into stereo signals L, R of two channels respectively, and applied to a switching circuit 33.

The switching circuit 33 outputs the stereo signals L, R from the first receiver TUN1 or the second receiver TUN2 in an alternative way to left and right power amplifiers 34L, 34R, and the circuit 33 is also provided with muting function.

The left and right stereo signals L, R output by the switching circuit 33 are amplified by the power amplifiers 34L, 34R and reproduced by loudspeakers 35L, 35R.

Being derived from the intermediate frequency amplifiers 27, 28, the outputs due to level detection of the intermediate frequency signals respectively, that is, outputs according to the received electric field intensity are applied to a central processing unit 36.

Further, a key board 37 which is able to instruct the operation of BSM function and the selection of desired frequencies to be received, and a display 38 on which received frequencies shall be indicated are both connected to the central processing unit 36.

Still more, PLL circuits 39, 40 which control oscillation frequencies of the local signal oscillators 25, 26 are connected to the central processing unit 36, and it is constituted that the coefficients N are given from the central processing unit 36 to a programmable frequency divider (not shown) of these PLL circuits 39, 40.

As a result, oscillation frequencies of the local signal oscillators 25, 26 are changed in accordance with the above-mentioned value N, so that respectively received frequencies of the first receiver TUN1 and the second receiver TUN2 are thereby changed.

The operation using the BSM function in accordance with the above construction is as follows.

Firstly, when the BSM command is inputted from the keyboard 37, control signal CTL is applied to the switching circuit 33 from the central processing unit 36 so as to start the muting operation therein.

Next, coefficients N are applied in turn according to the preset program to the programmable frequency divider of the PLL circuits 39 and 40 from the central processing unit 36, and the first and second receivers begin to sweep.

In this case, as shown in FIG. 2, the first receiver TUN1 sweeps in turn low frequency region in the received band 76.0–90.0 MHz, that is, 76.0–83.0 MHz, and the second receiver TUN2 sweeps high frequency region, that is, 83.1–90.0 MHz.

When the received broadcasting stations (A,B,C,D,E,F,G,H) are searched by respective sweepings of the first receiver TUN1 and second receiver TUN2, outputs derived from level detections of respective intermediate frequency signals, that is, outputs corresponding to the received electric field intensity are applied to the central processing unit 36 from the intermediate frequency amplifiers 27, 28 of the first and second receivers. When the existence of the received broadcasting stations (A,C,E,G,H) having quality higher than the predetermined level SL is recognized, the central processing unit 36 stores in turn the level and the received frequencies of those stations into the memory (not shown) which is within the central processing unit 36. Immediately after the completion of sweeping operations of the first and second receivers, the received frequencies stored within the memory are written into the predetermined assigned area of the memory in the order of the height of received levels (E,H,C,A,G).

Then, regarding the first receiver TUN1 as a main tuner, the coefficient N is given to the PLL circuit 39 in order to tune the received broadcasting station E whose received level is the highest among those received broadcasting stations. Thereafter, the central processing unit 36 outputs a control signal CTL to the switching circuit 33 so as to select the output signal from the MPX circuit 31 of the first receiver, putting an end to the muting operation, which results in that a broadcasting frequency of the highest reception quality in that area is received.

Also, it is possible to carry out a preset recall tuning of the stations stored by the above-mentioned function by means of the operation of preset buttons at the keyboard 37.

FIG. 3 illustrates another embodiment which can carry out the BSM function by a different programmed operation from that of the above illustrated receiver.

That is, in the embodiment illustrated in FIG. 3, both the first receiver TUN1 and the second receiver TUN2 sweep from lower end to upper end of the reception band.

When the electric field intensity level of a received broadcasting station obtained by the first receiver TUN1 is not less than the first specified level SL1, the received frequency (symbol □ in the figure) is stored in the memory.

Thereafter, the received broadcasting stations stored by a sweeping operation of the first receiver are the C, E and H stations in the illustration.

Similarly, when a level of the electric field intensity of the received broadcasting station obtained by the second receiver TUN2 is not less than the second specified level SL2, the received frequency (symbol Δ in the figure) is stored in the memory.

Therefore, the received broadcasting stations stored by a sweeping operation of the second receiver are the A, C, E, G and H stations in the illustration.

Immediately after the completion of the sweeping operation of the first and second receivers, the received frequencies stored in the memory are written in a preset area of the memory in the order of received levels (E,H,C,A,G).

Like the above explanation, the first receiver TUN1 is regarded as a main tuner, and a coefficient N is given to the PLL circuit 39 in order to carry out the tuning to the received broadcasting station E having the highest received level among those received broadcasting stations, and next the central processing unit 36 outputs a control signal CTL to the switching circuit 33 so as to select the output signal from the MPX circuit 31 of the first receiver, putting an end to the muting operation, which results in that a broadcasting frequency of the highest reception quality in that are is received.

Further, FIG. 4 illustrates another embodiment which can carry out the BSM function by a programmed operation different from that of the receiver illustrated in FIG. 3.

That is, in the embodiment of FIG. 4, both the first receiver TUN1 and the second receiver TUN2 sweep from the lower end to the upper end of the reception band, but the first receiver TUN1 starts sweeping a little earlier than the other.

When the electric field intensity levels of the respectively received broadcasting stations acquired by the first receiver TUN1 are higher than the first specified level SL1, those received frequencies (symbol □ in the figure) are stored in the memory.

Therefore, the received broadcasting stations stored by sweeping the first receiver are the C, E and H stations in the illustration.

Subsequently, the second receiver TUN2 sweeps. However, the second TUN2 sweeps the frequencies, but this time omitting the frequencies of the broadcasting stations already confirmed by the sweeping of the first receiver. As a result, the second receiver stores in the memory only the received frequencies (symbol Δ in the figure) having the electric field intensity level higher than the second level SL2 and not being stored by the first receiver TUN1. Therefore the received broadcasting stations stored by the sweeping operation of the second receiver are the stations of A and G.

The received frequencies stored in the memory immediately after the completion of the sweeping operation of the first and second receivers are written into the preset area of the memory in the order of received levels (E,H,C,A,G) and subsequently operate as explained above.

Still further, FIG. 5 illustrates another embodiment where the BSM function is executed by a programmed operation different from that explained in FIG. 4.

That is, in the embodiment of FIG. 5, both the first receiver TUN1 and the second receiver TUN2 sweep from the lower end to the upper end of the received band, but this time the second receiver TUN2 begins to sweep a little earlier than the other.

When the electric field intensity levels of the received broadcasting station acquired by the second receiver are not less than the second specified level SL2, the received frequencies (symbol  in the figure) are stored in the memory.

The received broadcasting stations stored by a sweeping operation of the second receiver become the stations A, C, E, G and H in the illustration.

Subsequently, the first receiver TUN1 sweeps. However, the first receiver sweeps only frequencies of the stations stored in the memory by the second receiver, and stores in its memory only stations (symbol □ in the figure) having the electric field intensity level not less than the first specified level SL1.

Accordingly, the received broadcasting stations stored by the sweeping of the first receiver are the stations C, E and H.

The received frequencies stored in the memory immediately after the completion of the sweeping operation of the second receiver and the first receiver are written into the preset area of the memory in the order of reception levels (E,H,C,A,G), and subsequent operations are similar to that explained above.

As is clearly seen from the above description, according to the first aspect of the radio receiver of the present invention, since the reception band is divided into first region and a second region, and a first and second receivers for sweeping frequencies of the respective regions are provided, the first receiver and the second receiver can sweep simultaneously, for example, frequencies of the first half and the second half of the reception band, whereby the time required for the sweeping operations can be reduced to about a half in comparison to the prior case that frequencies in the whole range from lower end to upper end are received and swept.

Also according to the second aspect of the radio receiver of the present invention, since it is provided with a first receiver and a second receiver for individually sweeping frequencies from lower end to upper end of the same reception band with their respective extraction sensitivity of the reception level which are different from each other, the time required for the receiving and sweeping operation can also be reduced to about a half in comparison with the BSM function in the prior art, wherein the reception level to be detected is raised in the first sweeping operation so as to set its sensitivity to the "LOCAL" position, and is lowered in the second sweeping operation so as to set it to the "DX" position.

What is claimed is:

1. A radio receiver where the reception band is divided into a first region and a second region, comprising:

a first receiving means for sweeping frequencies of said first region to receive signals corresponding to frequencies of broadcasting stations transmitting within a frequency range of said first region;

a second receiving means for sweeping frequencies of said second region to receive signals corresponding to frequencies of broadcasting stations transmitting within a frequency range of said second region, wherein said first and second receiving means simultaneously sweep frequencies in said first region and said second region; and a control means for storing frequencies of received broadcasting stations having a reception quality not less than a specified level obtained by sweeping frequencies in said first region and received broadcasting stations having a reception quality not less than said specified level obtained by sweeping frequencies in said second region into a memory means in the order of the height of reception quality level.

2. A radio receiver comprising:

a first receiving means and a second receiving means for individually sweeping frequencies from a lower end to an upper end in one reception band; and control means for selectively storing frequencies of received broadcasting stations having a reception quality not less than a first specified level obtained by a sweeping operation performed by said first receiving means and the received broadcasting stations having a reception quality not less than a second specified level obtained by a sweeping operation performed by said second receiving means into a memory means in the order of the height of reception quality level, said first specified level and said second specified level being respectively different from each other;

wherein the sweeping operations performed by said first receiving means and said second receiving means start simultaneously, whereby said control means stores in said memory means frequencies of broadcasting stations received by said first receiving means having reception quality not less than the first specified level, and stores frequencies of broadcasting stations received by said second receiving means having reception quality not less than the second specified level.

3. A radio receiver comprising:

a first receiving means and a second receiving means for individually sweeping frequencies from a lower end to an upper end in one reception band; and control means for selectively storing frequencies of received broadcasting stations having a reception quality not less than a first specified level obtained by a sweeping operation performed by said first receiving means and frequencies of received broadcasting stations having a reception quality not less than a second specified level obtained by a sweeping operation performed by said second receiving means into a memory means in the order of the height of reception quality level, said first specified level and said second specified level being respectively different from each other;

wherein the sweeping operation performed by said first receiving means starts a short time earlier than that performed by said second receiving means, whereby said control means stores in said memory means frequencies of broadcasting stations received by said first receiving means having reception quality not less than the first specified level, and frequencies of broadcasting stations received by said second receiving means having reception quality not less than the second specified level and not stored in response to the sweeping operation of said first receiving means.

4. A radio receiver comprising:

a first receiving means and a second receiving means for individually sweeping frequencies from a lower end to an upper end in one reception band; and control means for selectively storing frequencies of received broadcasting stations having a reception quality not less than a first specified level obtained by a sweeping operation performed by said first receiving means and frequencies of received broadcasting stations having a reception quality not less than a second specified level obtained by a sweeping operation performed by said second receiving means into a memory means in the order of the height of reception quality level, said first specified level and said second specified level being respectively different from each other;

wherein the sweeping operation performed by said second receiving means starts a short time eariler than that performed by said first receiving means, whereby said control means stores in said memory means frequencies of broadcasting stations received by said second receiving means having reception quality not less than the second specified level, and said first receiving means sweeps and said control means stores in said memory means only frequencies of broadcasting stations having reception quality not less than the first specified level and not already stored in response to the sweeping operation of said second receiving means.

* * * * *